(12) United States Patent
Higuchi et al.

(10) Patent No.: US 9,166,032 B1
(45) Date of Patent: Oct. 20, 2015

(54) NON-VOLATILE MEMORY DEVICE

(71) Applicant: Kabushiki Kaisha Toshiba, Minato-ku (JP)

(72) Inventors: Masaaki Higuchi, Yokkaichi (JP); Katsuyuki Sekine, Yokkaichi (JP); Fumiki Aiso, Kuwana (JP); Takuo Ohashi, Kuwana (JP); Tatsuya Okamoto, Inabe (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/483,725

(22) Filed: Sep. 11, 2014

Related U.S. Application Data

(60) Provisional application No. 62/016,297, filed on Jun. 24, 2014.

(51) Int. Cl.
| | | |
|---|---|---|
| *H01L 31/072* | (2012.01) | |
| *H01L 31/109* | (2006.01) | |
| *H01L 31/0328* | (2006.01) | |
| *H01L 31/0336* | (2006.01) | |
| *H01L 29/778* | (2006.01) | |
| *H01L 21/02* | (2006.01) | |

(52) U.S. Cl.
CPC .......... *H01L 29/7785* (2013.01); *H01L 21/0262* (2013.01)

(58) Field of Classification Search
CPC ............... H01L 21/02642; H01L 21/0262; H01L 21/043; H01L 21/048; H01L 21/28194; H01L 21/28556; H01L 21/31658; H01L 21/8229; H01L 21/7682; H01L 21/76831; H01L 27/11507; H01L 27/11514; H01L 27/11524; H01L 27/11558; H01L 27/7785; H01L 29/8615; H01L 39/2438

USPC ......... 438/270, 381, 386, 680, 712, 753, 756, 438/757, 474, 770, 257, 258, 259; 257/196, 257/183, 168, E21.006, E21.011, E21.045, 257/E21.121, E21.126, E21.127, E21.17, 257/E21.218, E21.267, E21.278, E21.293, 257/E21.311, E21.321, E21.613, 188
See application file for complete search history.

(56) References Cited

U.S. PATENT DOCUMENTS

| | | | | |
|---|---|---|---|---|
| 7,910,973 | B2 * | 3/2011 | Sakaguchi et al. ............ | 257/298 |
| 7,982,260 | B2 * | 7/2011 | Fukuzumi et al. ............ | 257/324 |
| 8,017,991 | B2 * | 9/2011 | Kim et al. ...................... | 257/318 |

(Continued)

FOREIGN PATENT DOCUMENTS

| | | |
|---|---|---|
| JP | 2010-147125 A | 7/2010 |
| JP | 2012-119445 A | 6/2012 |

*Primary Examiner* — David Nhu
(74) *Attorney, Agent, or Firm* — Oblon, McClelland, Maier & Neustadt, L.L.P.

(57) ABSTRACT

According to one embodiment, a non-volatile memory device includes a plurality of electrodes, at least one semiconductor layer, conductive layers, and first and second insulating films. The electrodes are arranged side by side in a first direction. The semiconductor layer extends into the electrodes in the first direction. The conductive layers are provided between each electrode and the semiconductor layer and separated from each other in the first direction. The first insulating film contacts the conductive layers, and extends in the first direction along the semiconductor layer between the conductive layers and the semiconductor layer. The second insulating film is provided between the first insulating film and the semiconductor layer. The first insulating film includes a first portion located between the conductive layers and the second insulating film, and a second portion located between the interlayer insulating film and the second insulating film.

20 Claims, 12 Drawing Sheets

(56) References Cited

U.S. PATENT DOCUMENTS

| | | | |
|---|---|---|---|
| 8,159,012 B2 * | 4/2012 | Lee et al. ............. 257/296 |
| 8,338,244 B2 | 12/2012 | Son et al. |
| 8,338,876 B2 * | 12/2012 | Kito et al. ............. 257/315 |
| 2012/0132981 A1 | 5/2012 | Imamura et al. |

* cited by examiner

NON-VOLATILE MEMORY DEVICE

CROSS-REFERENCE TO RELATED APPLICATIONS

This application is based upon and claims the benefit of priority from U.S. Provisional Patent Application 62/016,297, filed on Jun. 24, 2014; the entire contents of which are incorporated herein by reference.

FIELD

Embodiments described herein relate generally to a non-volatile memory device.

BACKGROUND

In order to realize a next-generation non-volatile memory device, the development of a memory cell array having a three-dimensional structure has been progressing. The memory cell array having a three-dimensional structure includes a plurality of word lines stacked and memory cells formed inside a memory hole passing through the word lines. In such a non-volatile memory device, an improvement in the retention characteristics of data is required.

DETAILED DESCRIPTION

Figure 1:
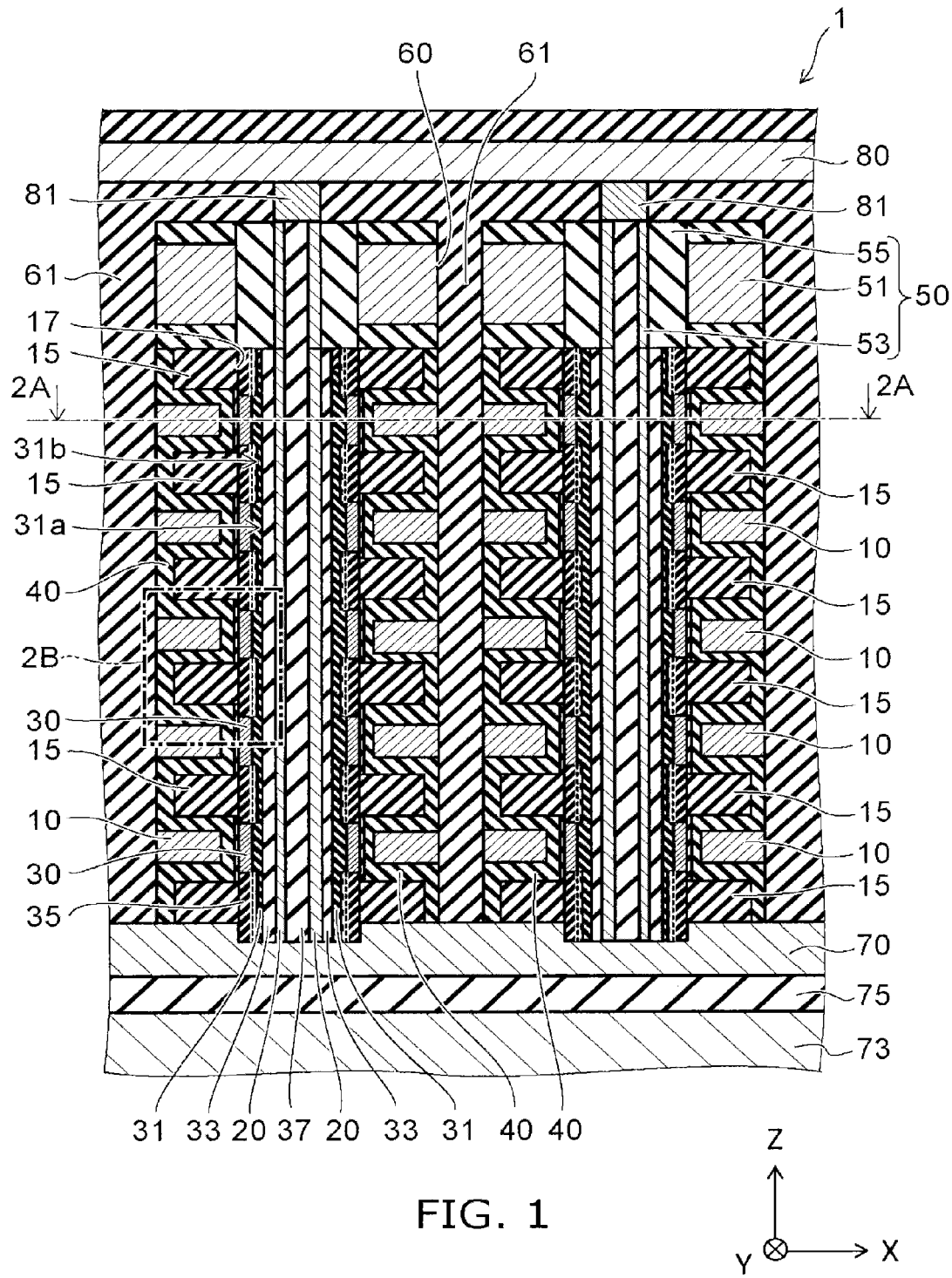
FIG. 1 a schematic cross-sectional view illustrating a non-volatile memory device according to a first embodiment.

According to one embodiment, a non-volatile memory device includes a plurality of electrodes, at least one semiconductor layer, conductive layers, a first insulating film, and a second insulating film. The electrodes are arranged side by side in a first direction with an interlayer insulating film interposed. At least one semiconductor layer extends into the electrodes in the first direction. The conductive layers are provided between each of the electrodes and the semiconductor layer. The conductive layers are separated from each other in the first direction. The first insulating film is in contact with the conductive layers, and extends in the first direction along the semiconductor layer between the conductive layers and the semiconductor layer. The second insulating film is provided between the first insulating film and the semiconductor layer. The second insulating film has an energy bandgap wider than an energy bandgap of the first insulating film. The first insulating film includes a first portion located between the conductive layers and the second insulating film, and a second portion located between the interlayer insulating film and the second insulating film. A thickness of the first portion in a direction perpendicular to the first direction is larger than a thickness of the second portion in the direction perpendicular to the first direction.

Various embodiments will be described hereinafter with reference to the accompanying drawings. The same portions in the drawings are denoted by the same reference numerals and signs, and thus the detailed description thereof will be appropriately omitted, and different portions will be described. Meanwhile, the drawings are schematic or conceptual, a relationship between the thickness and the width of each portion, a size ratio between the components, and the like are not necessarily identical to those in reality. Even when the same portions are shown, mutual dimensions or ratios may be shown differently in the drawings. The arrangement of each element may be described using XYZ-axis directions shown in the drawings. The X-axis, the Y-axis, and the Z-axis are orthogonal to each other, a Z-axis direction may be represented as an upward direction, and a direction opposite thereto may be represented as a downward direction.

First Embodiment

FIG. 1 is a schematic cross-sectional view illustrating a non-volatile memory device 1 according to a first embodiment. The non-volatile memory device 1 shown in FIG. 1 is one example, and the embodiment is not limited thereto.

The non-volatile memory device 1 includes, for example, a plurality of electrodes (hereinafter, control gate 10) arranged side by side in a first direction (hereinafter, Z-direction) perpendicular to a substrate, and at least one semiconductor layer (hereinafter, channel body 20) extending into a plurality of control gates 10 in the Z-direction.

The control gates 10 are arranged side by side in the Z-direction through, for example, interlayer insulating films 15. The control gates 10 and the interlayer insulating films 15 are alternately arranged in the Z-direction. The channel body 20 is provided inside, for example, a memory hole 17 passing through the control gate 10 and the interlayer insulating film 15 in the Z-direction.

The non-volatile memory device 1 includes further a conductive layer 30, a first insulating film 31, and a second insulating film 33 between each of the plurality of control gates 10 and the channel body 20. The conductive layer 30 is provided between the first insulating film 31 and each of the control gates 10. The conductive layers 30 are provided to be separated from each other in the Z-direction. The first insulating film 31 is in contact with the conductive layer 30. The second insulating film 33 is provided between the first insulating film 31 and the channel body 20. The second insulating film 33 extends in the Z-direction along the channel body 20, and has an energy bandgap wider than that of the first insulating film 31.

The first insulating film 31 extends in the Z-direction along the channel body 20. The first insulating film 31 includes a first portion 31a located between the conductive layer 30 and the first insulating film 31, and a second portion 31b located between the interlayer insulating film 15 and the first insulating film 31 (see FIG. 2B). The thickness of the first portion 31a in a direction perpendicular to the Z-direction is larger than the thickness of the second portion 31b in a direction perpendicular to the Z-direction.

Figure 2A:
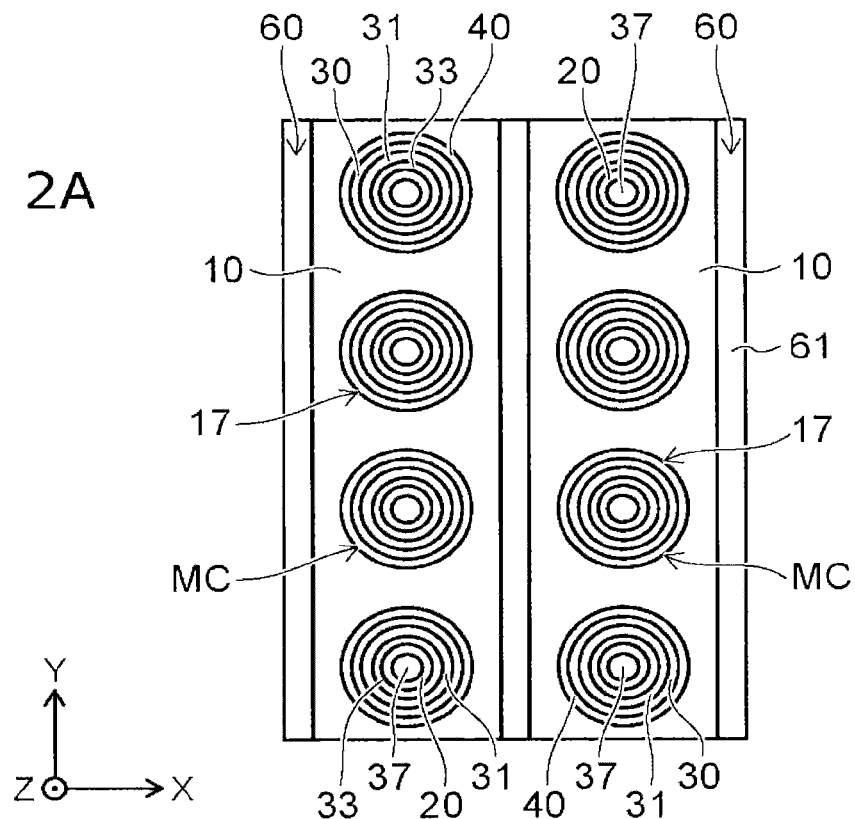
FIGS. 2A and 2B are other schematic views illustrating the non-volatile memory device according to the first embodiment.
Figure 2B:
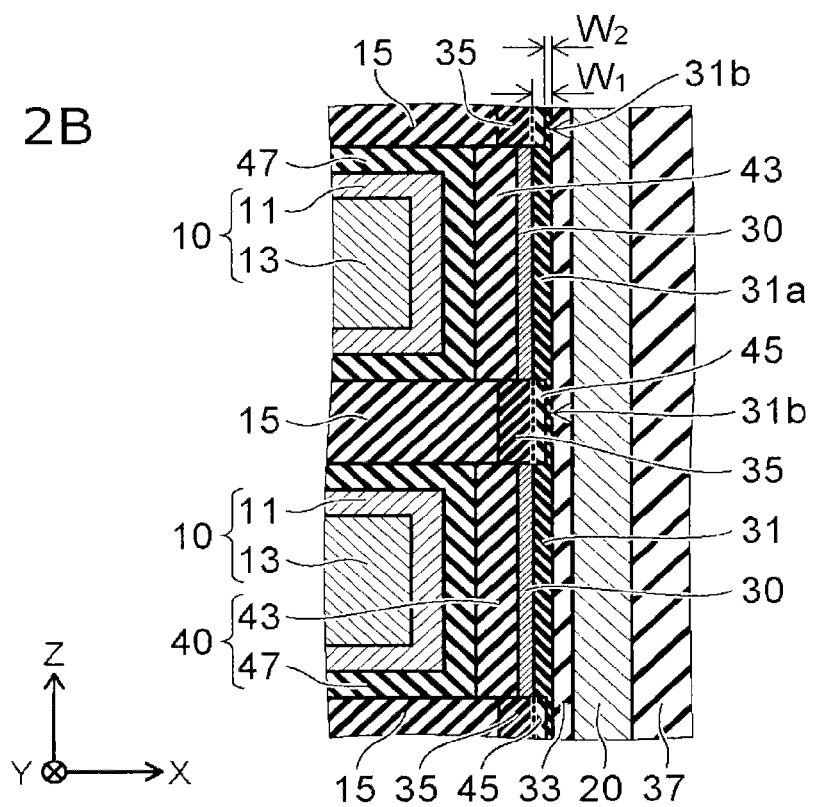

Next, the non-volatile memory device 1 will be described in detail with reference to FIG. 1 to FIG. 2B. FIGS. 2A and 2B are other schematic views illustrating the non-volatile memory device 1 according to the first embodiment. FIG. 2A is a cross-sectional view taken along line 2A-2A shown in FIG. 1. FIG. 2B is a partially enlarged cross-sectional view of a region 2B shown in FIG. 1.

As shown in FIG. 1, the plurality of control gates 10 are provided on a source interconnection 70. The source interconnection 70 is provided on, for example, a substrate 73 with an interlayer insulating film 75 interposed therebetween. The memory hole 17 is in communication with the source interconnection 70. The channel body 20 extends in the Z-direction along the inner wall of the memory hole 17. The channel body 20 is electrically connected to the source interconnection 70 at the bottom of the memory hole 17.

A selection transistor 50 is provided on the uppermost layer of the control gate 10 in the Z-direction. The selection transistor 50 includes a selection gate 51, a channel body 53, and a gate insulating film 55. The channel body 53 is electrically connected to the channel body 20. The gate insulating film 55 is provided between the selection gate 51 and the channel body 53.

Further, a bit line 80 is provided on the selection transistor 50. The bit line 80 is electrically connected to the channel body 53 through a contact plug 81. The bit line 80 is electrically connected the channel body 20 through the selection transistor 50.

The bit line 80 extends, for example, in the X-direction. The bit line 80 is electrically connected to a plurality of channel bodies 20 arranged side by side in the X-direction. The selection transistor 50 selects one of the plurality of channel bodies 20 which are electrically connected to one bit line 80. That is, the selection transistor 50 provided on one channel body 20 is set to be in an on state, and the selection transistor 50 provided on another channel body 20 is set to be in an off state, to thereby select one channel body 20.

As shown in FIG. 2A, the control gate 10 extends in the Y-direction. The plurality of control gates 10 are arranged side by side in the X-direction. An insulating film 61 is provided between the control gates 10 next to each other. The insulating film 61 is provided inside a slit 60 which is provided between the control gates 10 next to each other.

The slit 60 is, for example, a groove having a depth from the selection gate 51 to the source interconnection 70, and extends in the Y-direction. In this example, the slit 60 is formed for each memory hole 17 in the X-direction, but the embodiment is not limited thereto. For example, the slit 60 may be formed in for each of a plurality of memory holes arranged side by side in the X-direction. In other words, the control gate 10 may be formed so as to surround two or more memory holes which are respectively arranged side by side in the X-direction and the Y-direction.

As shown in FIG. 2A, one control gate 10 is provided with the plurality of memory holes 17. In this example, the plurality of memory holes 17 are formed so as to be lined up in a row in the Y-direction, but the embodiment is not limited to this example. The plurality of memory holes passing through one control gate 10 may be arranged, for example, in a matrix within the X-Y plane, and may be arranged in zigzag.

The cross-section of the memory hole 17 perpendicular to the Z-direction is, for example, circular. The memory hole 17 includes an insulating core 37, the channel body 20, the second insulating film 33, the first insulating film 31, the conductive layer 30, and a fourth insulating film 40 in this order, from the center thereof.

The memory cell MC is formed between each control gate 10 and the channel body 20. The memory cell MC includes the second insulating film 33, the first insulating film 31, the conductive layer 30, and the fourth insulating film 40 from the channel body 20 side. The second insulating film 33 functions as, for example, a tunnel insulating film. The conductive layer 30 serves as a charge storage layer (or, floating gate), for example. The fourth insulating film 40 functions as, for example, a block insulating film.

As shown in FIG. 2B, the first insulating film 31 includes the first portion 31a and the second portion 31b. The first portion 31a is located between the conductive layer 30 and the second insulating film 33. The second portion 31b is located between the interlayer insulating film 15 and the second insulating film 33. The thickness $W_1$ of the first portion 31a in a direction perpendicular to the Z-direction is larger than the thickness $W_2$ of the second portion 31b in a direction perpendicular to the Z-direction.

The fourth insulating film 40 is provided between the control gate 10 and the conductive layer 30, and includes a first layer 43 and a second layer 47. The first layer 43 is located between the conductive layer 30 and the second layer 47. The second layer 47 is located between the control gate 10 and the first layer 43. The second layer 47 extends between the control gate 10 and the interlayer insulating film 15 adjacent thereto. The dielectric constant of the second layer 47 is higher than the dielectric constant of the first layer 43.

The non-volatile memory device 1 further includes a fifth insulating film 45. The fifth insulating film 45 is provided between a third insulating film 35 and the first insulating film 31. As described later, the fifth insulating film 45 is, for example, a portion in which the first insulating film 31 is oxidized.

Next, operations of the non-volatile memory device 1 according to the first embodiment will be described with reference to FIGS. 3A to 5B. FIGS. 3A to 5B are energy band diagrams of the memory cell MC. Chart A of each drawing is a band diagram of the memory cell MC of the non-volatile memory device 1 according to the embodiment, and chart B is a band diagram of the memory cell MC of a non-volatile memory device according to a comparative example. In each drawing, the control gate 10 is a metal, and the channel body 20 and the conductive layer 30 are semiconductors, for example, silicon.

Figure 3A:
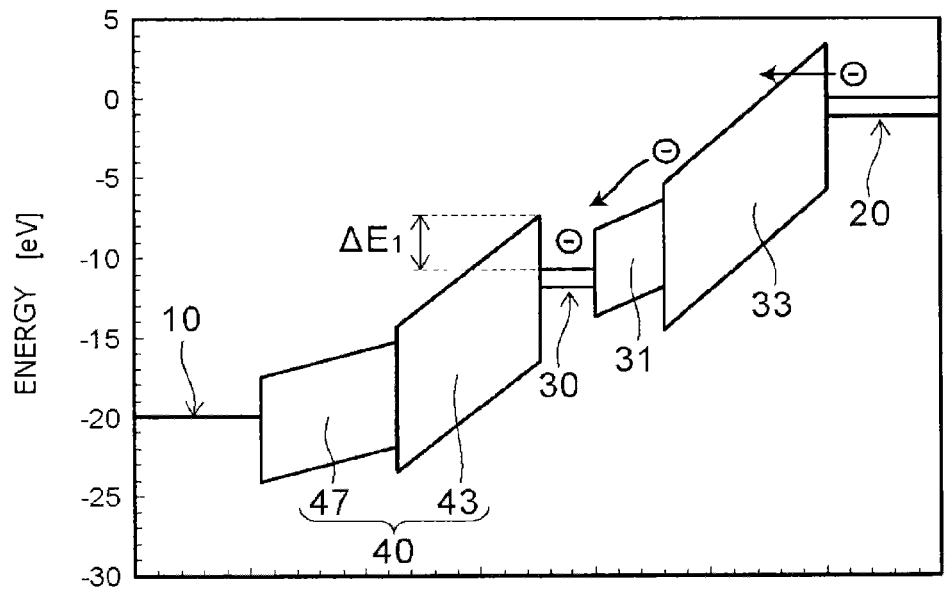
FIGS. 3A to 5B are energy band diagrams of a memory cell of the non-volatile memory device according to the first embodiment.
Figure 3B:
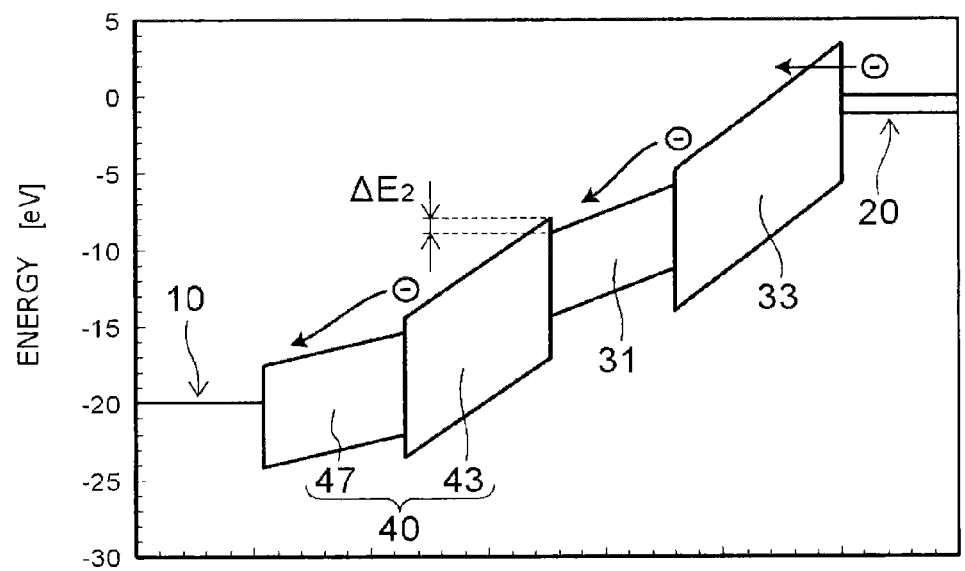
Figure 4A:
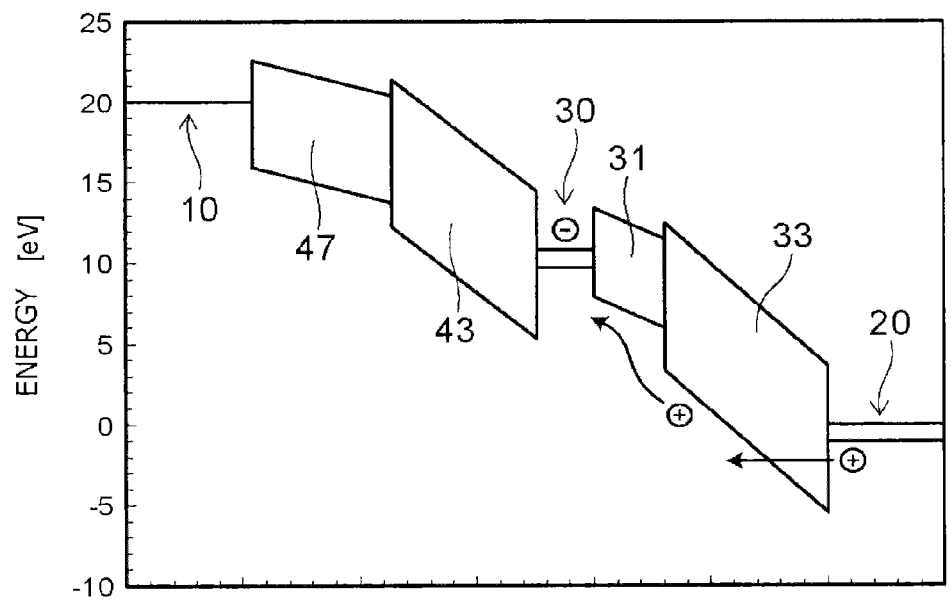
Figure 4B:
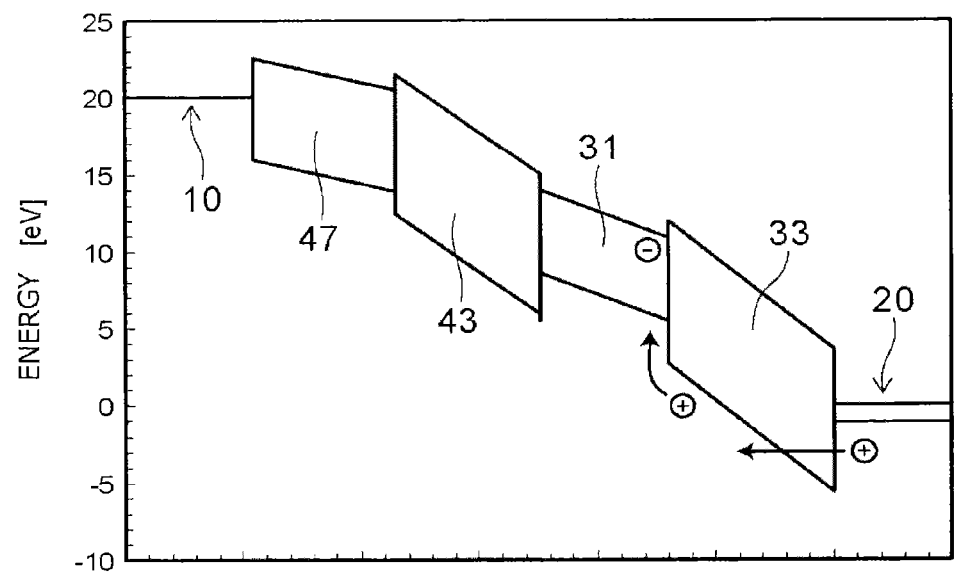
Figure 5A:
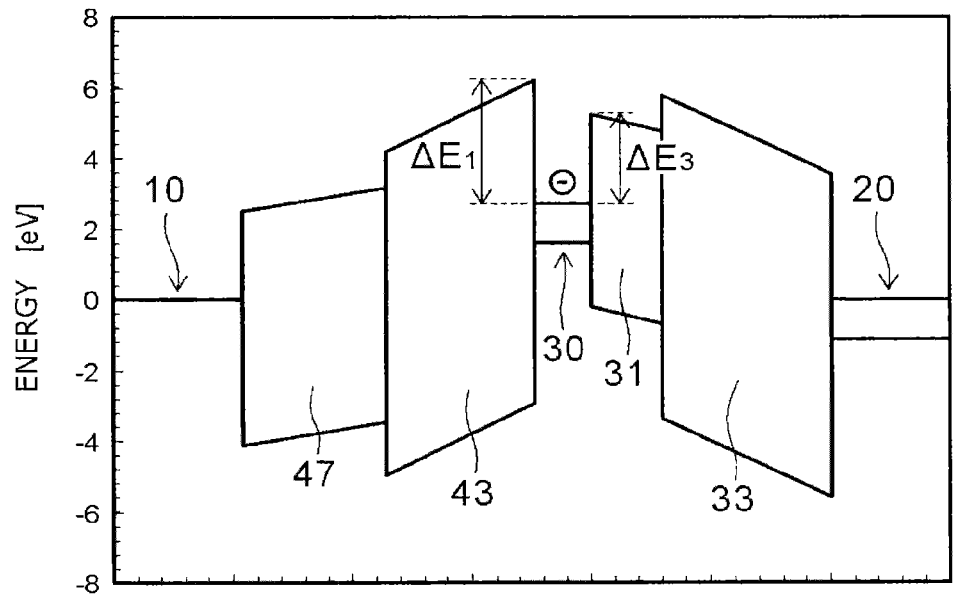
Figure 5B:
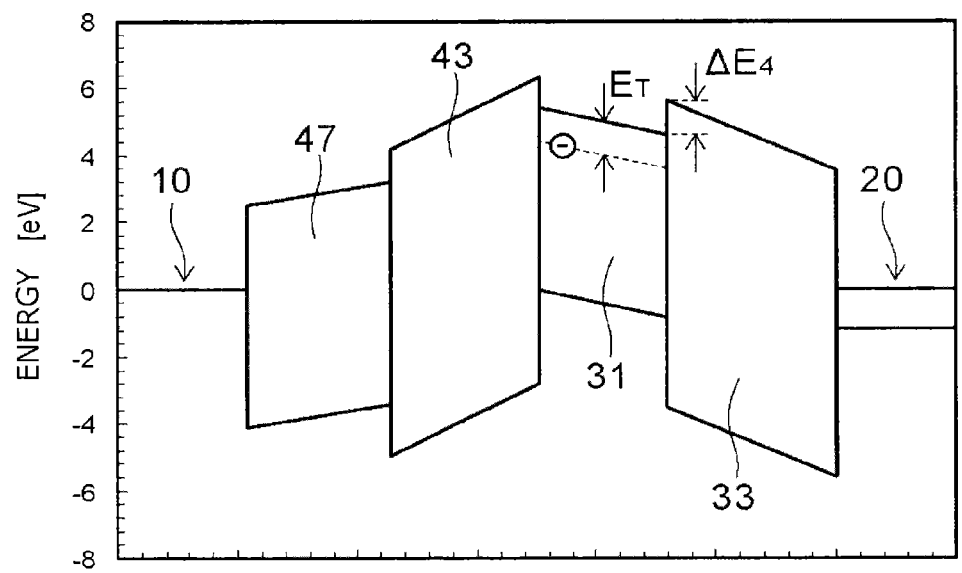

FIGS. 3A and 3B show an operations of writing data. FIGS. 4A and 4B show states in which data is held. FIGS. 5A and 5B show erasing operations of data.

As shown in FIGS. 3A and 3B, the energy gap of the first insulating film 31 is smaller than the energy gap of the second insulating film 33. During data writing, a potential difference of, for example, 20 V is given between the control gate 10 and the channel body 20. Thereby, an electric field occurs in the second insulating film 33, and electrons of the channel body 20 pass through the second insulating film and are injected into the first insulating film 31. The electrons injected into the first insulating film 31 are transferred to the conductive layer 30.

In the example of FIG. 3A, an energy barrier $\Delta E_1$ is present between the conductive layer 30 and the fourth insulating film 40, the transfer of the electrons from the conductive layer 30 to the fourth insulating film 40 is interfered with. Thereby, it is possible to reduce a gate leakage current. The electrons are stored in the conductive layer 30, and data is stored.

On the other hand, in the example shown in FIG. 3B, the conductive layer 30 is not provided, and a portion of the electrons injected into the first insulating film 31 is captured by, for example, a trap in the first insulating film 31. Thereby, data can be stored in the memory cell MC, but the amount of charge stored therein depends on a trap density and is smaller than in the example of FIG. 3A. Therefore, the shift amount of a threshold voltage in the memory cell MC is also smaller.

An energy barrier $\Delta E_2$ between the first insulating film 31 and the fourth insulating film 40 becomes smaller than $\Delta E_1$. For example, when the first layer 43 of the fourth insulating film 40 is formed of a silicon oxide film and the conductive layer 30 is formed of silicon, $\Delta E_1$ is appropriately 3.5 eV, and $\Delta E_2$ is appropriately 1.0 eV.

In the example of FIG. 3B, the electrons injected into the first insulating film 31 are transferred into the third insulating film in excess of the energy barrier $\Delta E_2$ of 1.0 eV, and can flow into the control gate 10. That is, a gate leakage current becomes larger than in the example shown in FIG. 3A.

As shown in FIGS. 4A and 4B, during data erasure, a potential difference of, for example, −20 V is given between the control gate 10 and the channel body 20. Thereby, holes are injected from the channel body 20 through the second insulating film 33 into the first insulating film 31. The holes injected into the first insulating film 31 are transferred to the conductive layer 30, and are recombined with the stored electrons. Thereby, the electrons stored in the conductive layer 30 are annihilated, and thus data can be erased.

As shown in FIG. 5A, the electrons stored in the conductive layer 30 are held in a potential well surrounded by the energy barrier $\Delta E_1$ and $\Delta E_3$. When the first insulating film 31 is formed of, for example, a silicon nitride film, $\Delta E_3$ is appropriately 2.5 eV. Thereby, it is possible to stably hold charge in the conductive layer 30. In addition, the amount of charge capable of being held in the conductive layer 30 is larger than the amount of charge capable of being held by the memory cell MC of FIG. 5B.

In the example shown in FIG. 5B, electrons captured by the trap in the first insulating film 31 are held as stored charge. For example, the depth $E_T$ of the trap level of the first insulating film 31 is appropriately 1 eV. For example, when the first insulating film 31 is formed of a silicon nitride film and the second insulating film 33 is formed of a silicon oxide film, an energy barrier $\Delta E_4$ between the first insulating film 31 and the second insulating film 33 is appropriately 1 eV. In a case where the electrons captured by the trap in the first insulating film 31 are excited to a thermally valence band and can transfer through the first insulating film 31, the electrons can be transferred out of the memory cell MC when the electrons exceed the energy barrier $\Delta E_4$ of 1 eV.

On the other hand, when charge stored in the conductive layer 30 does not exceed an energy barrier $\Delta E_3$ of at least 2.5 eV, the charge is not able to be transferred out of the memory cell MC. That is, the memory cell MC of FIG. 5A is more excellent in the holding characteristics of charge than the memory cell MC of FIG. 5B.

Further, a portion of electrons injected from the channel body 20 is captured by the trap of the first insulating film 31. Therefore, the first insulating film 31 also functions as an electron storage layer. In addition, electrons transferred from the conductive layer 30 to the first insulating film 31 are also captured by the trap of the first insulating film 31. That is, in the embodiment, it is possible to increase the amount of charge stored, for example, while maintaining an advantage that charge in an ONO (Oxide-Nitride-Oxide) structure in which a silicon nitride film is used as a charge storage layer is not likely to be transferred.

In this manner, in the non-volatile memory device 1 according to the embodiment, the memory cell MC includes the conductive layer 30 and the first insulating film 31, and thus increases the amount of charge stored. In addition, the data holding characteristics of the memory cell MC are also improved. Further, the conductive layers 30 provided between each of the control gates 10 next to each other and the channel body 20 are provided so as to be separated from each other in the Z-direction. Thereby, the transfer of charge held in the conductive layer 30 in the Z-direction is also restricted, and the data holding characteristics are improved.

Next, a method for manufacturing the non-volatile memory device 1 according to the first embodiment will be described with reference to FIGS. 6A to 6J. FIGS. 6A to 6J are schematic cross-sectional views illustrating processes of manufacturing the non-volatile memory device 1.

Figure 6A:
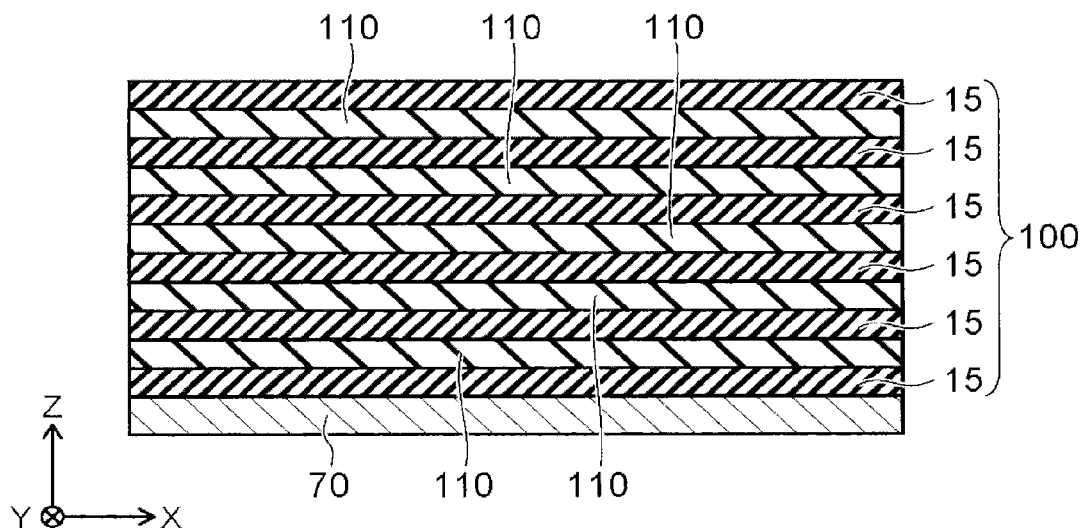
FIGS. 6A to 6J are schematic cross-sectional views illustrating a method for manufacturing the non-volatile memory device according to the first embodiment.

As shown in FIG. 6A, for example, the interlayer insulating film 15 and a sacrifice film 110 are alternately stacked on the source interconnection 70 in the Z-direction. Thereby, a stacked body 100 including a plurality of interlayer insulating films 15 and a plurality of sacrifice films 110 is formed.

The interlayer insulating film 15 is, for example, a silicon oxide film. The sacrifice film 110 is, for example, a silicon nitride film. The interlayer insulating film 15 and the sacrifice film 110 can be continuously formed using, for example, a CVD (Chemical Vapor Deposition) method.

Figure 6B:
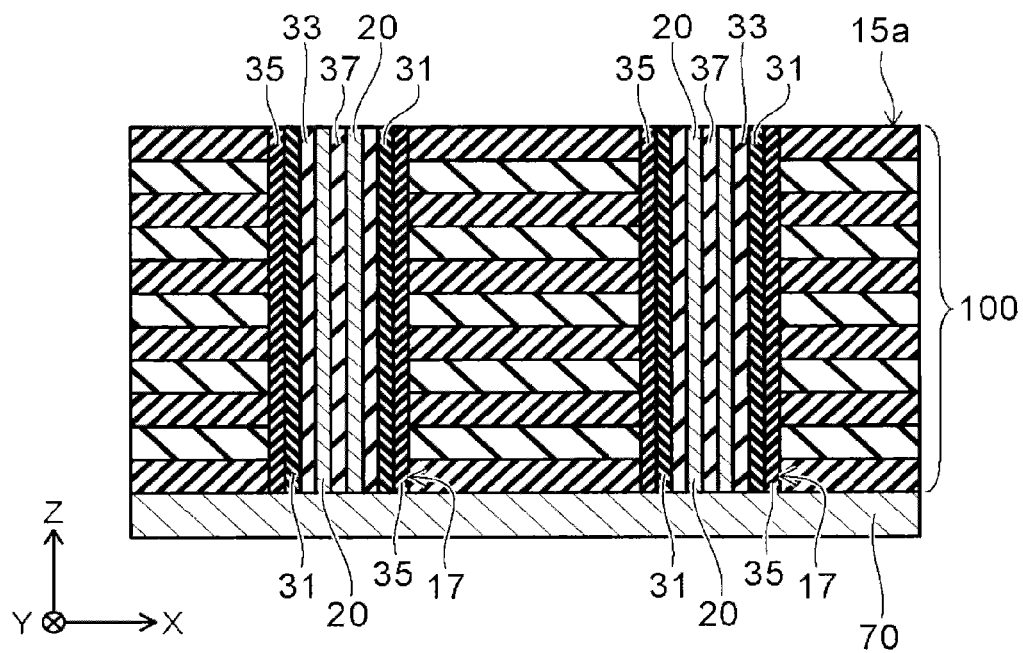

As shown in FIG. 6B, the memory hole 17 passing through the stacked body 100 in the Z-direction is formed. The channel body 20, the first insulating film 31, the second insulating film 33, and the third insulating film 35 are formed in the inside thereof.

For example, the memory hole 17 communicating from an interlayer insulating film 15a, which is an uppermost layer, of the plurality of interlayer insulating films 15 to the source interconnection 70 is formed. The memory hole 17 is formed by, for example, selectively etching the interlayer insulating film 15 and the sacrifice film 110 using RIE (Reactive Ion Etching).

The third insulating film 35, the first insulating film 31 and the second insulating film 33 are formed in this order on the inner wall of the memory hole 17. The third insulating film 35 is, for example, a silicon oxide film. The first insulating film 31 is, for example, a silicon nitride film. For example, a material having an energy bandgap larger than that of the first insulating film 31 is used in the second insulating film 33. The second insulating film 33 is, for example, a silicon oxide film. The first insulating film 31, the second insulating film 33 and the third insulating film 35 are formed using, for example, a CVD method or an ALD (Atomic Layer Deposition) method.

The channel body 20 is formed on the second insulating film 33. The channel body 20 is, for example, a polycrystalline silicon (polysilicon). The channel body 20 is formed using, for example, a CVD method or an ALD method. Subsequently, the core 37 that buries a space inside the memory hole 17 is formed. The core 37 has insulating properties, and is, for example, a silicon oxide film.

Figure 6C:
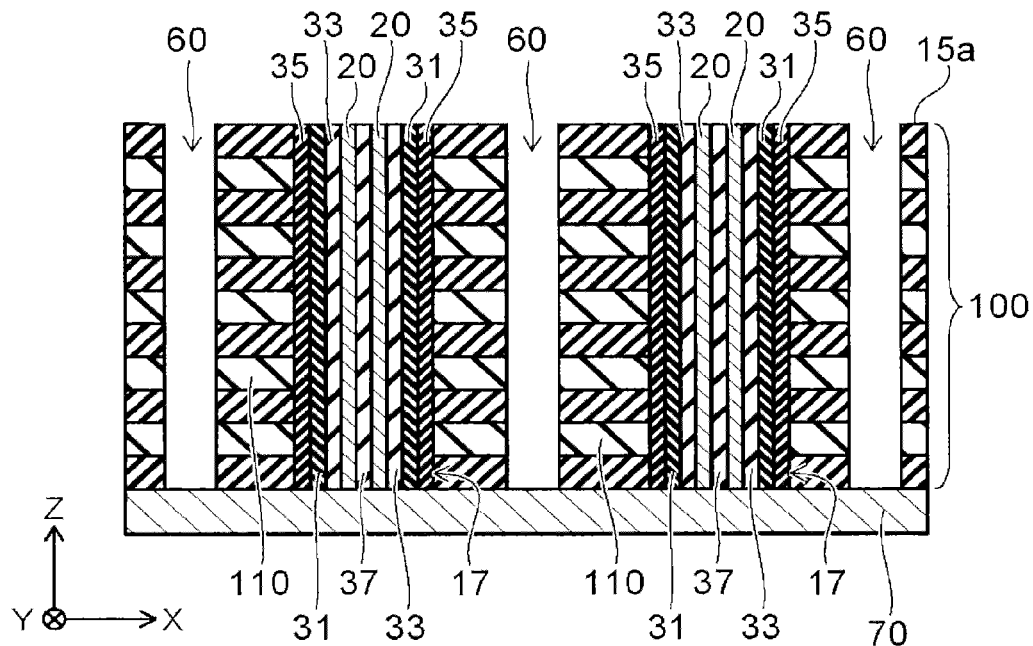

As shown in FIG. 6C, the slit 60 is formed. The slit 60 is a groove having a depth from the interlayer insulating film 15a to the source interconnection 70, and extends in the Y-direction. The slit 60 divides the stacked body 100 into a plurality of portions in portions except for the memory hole 17 of the stacked body 100. The slit 60 is formed by, for example, selectively etching the interlayer insulating film 15 and the sacrifice film 110 using RIE.

Figure 6D:
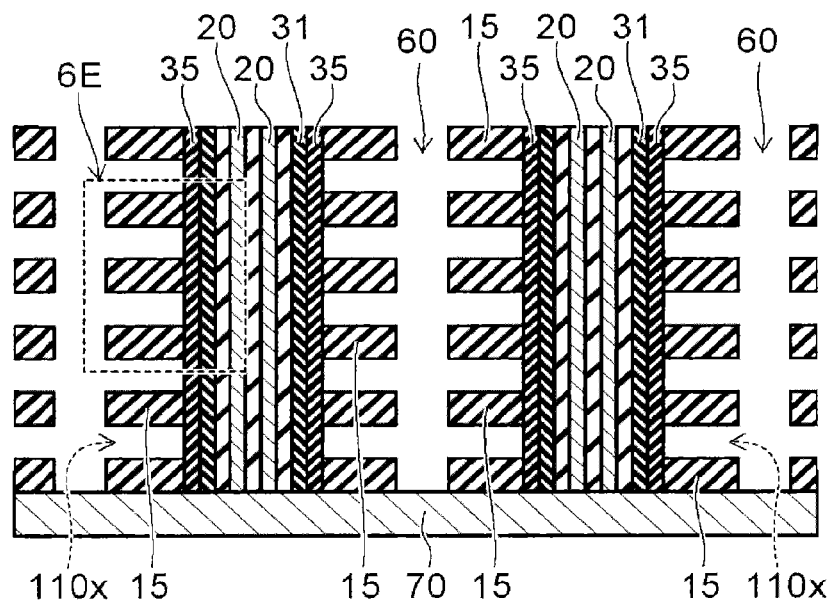

As shown in FIG. 6D, the sacrifice film 110 is selectively removed through the slit 60. For example, the interlayer insulating film 15 is a silicon oxide film, and the sacrifice film 110 is a silicon nitride film. In the inner wall of the memory hole 17, the third insulating film 35 that is in contact with the sacrifice film 110 is, for example, a silicon oxide film. The sacrifice film 110 can be selectively removed by, for example, wet etching using a hot phosphoric acid by which a silicon nitride film is etched and a silicon oxide film is not etched.

Hereinafter, processes of forming the control gate 10 and the conductive layer 30 will be described with reference to FIGS. 6E to 6J. FIGS. 6E to 6J are partially enlarged cross-sectional views showing a region 6E shown in FIG. 6D.

Figure 6E:
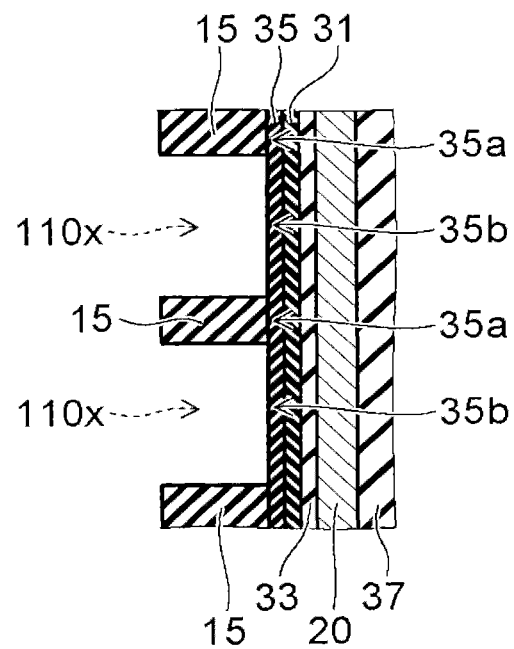

As shown in FIG. 6E, the interlayer insulating film 15 and the third insulating film 35 are exposed to a space 110x in which the sacrifice film 110 is removed. The third insulating film 35 includes a first portion 35a and a second portion 35b. The first portion 35a is located between the interlayer insulating film 15 and the first insulating film 31, and the second portion 35b is exposed to the space 110x.

Figure 6F:
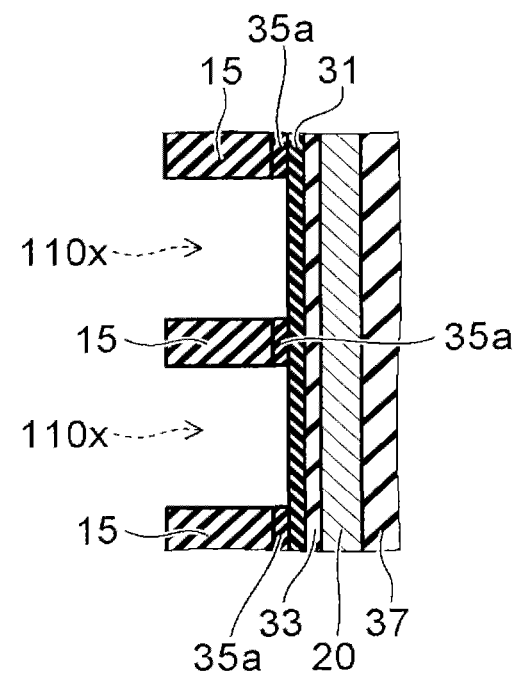

As shown in FIG. 6F, the second portion 35b of the third insulating film 35 exposed to the space 110x is etched, and the first insulating film 31 is exposed. For example, the interlayer insulating film 15 and the third insulating film 35 are etched using an etching condition in which a silicon oxide film is etched and a silicon nitride film is not etched. Thereby, the first insulating film 31 can be exposed to the inside of the space 110x. Since the thickness of the third insulating film 35 is smaller than that of the interlayer insulating film 15, it is possible to leave the interlayer insulating film 15 behind, and to remove the second portion 35b of the third insulating film.

Figure 6G:
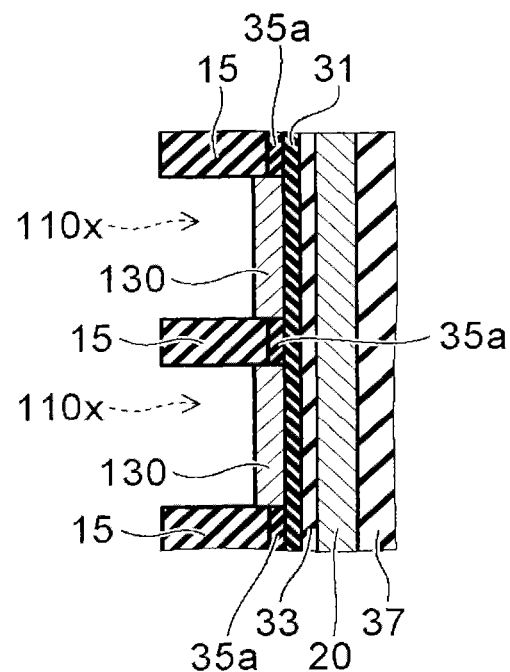

As shown in FIG. 6G, a conductive layer 130 is selectively formed on the first insulating film 31 exposed to the space 110x. The conductive layer 130 is, for example, a silicon layer which is epitaxially grown. A source gas for forming the conductive layer 130 is supplied through the slit 60 and the space 110x.

When the first insulating film 31 is, for example, a silicon nitride film, a silicon core can be selectively formed on the first insulating film 31 using a CVD method. That is, in a deposition process of silicon using a CVD method, silicon can be selectively deposited on a silicon nitride film during a so-called incubation time.

Subsequently, the forming conditions of silicon are changed from a CVD mode to an epitaxial mode. Thereby, it is possible to form the conductive layer 130 using the silicon core formed on the first insulating film 31 as a base. The term "CVD mode" as used herein refers to, for example, a condition in which an amorphous silicon layer or a polysilicon layer can be deposited without depending on a base. The term "epitaxial mode" as used herein refers to, for example, a condition in which silicon crystal is grown depending on the crystal of a base. In the epitaxial mode, it is possible to selectively perform crystal growth on silicon. The silicon layer formed in the epitaxial mode is, for example, a single crystal silicon or polysilicon.

Figure 6H:
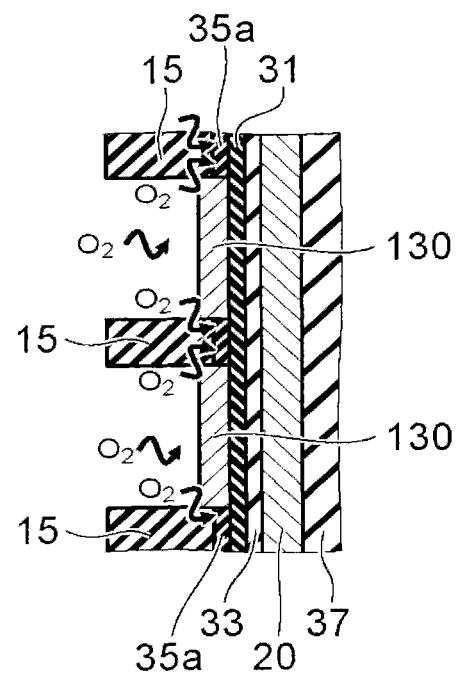

As shown in FIG. 6H, oxygen $O_2$ is supplied, and the conductive layer 130 is oxidized. Oxygen is supplied through the slit 60 and the space 110x. The conductive layer 130 is, for example, thermally oxidized. In addition, oxygen radicals obtained by ionizing oxygen atoms using plasma or the like may be supplied, and the conductive layer 130 may be oxidized.

A silicon oxide film has a property of allowing the passage of oxygen therethrough. Therefore, when the interlayer insulating film 15 and the third insulating film 35 are silicon oxide films, oxygen passes through the interlayer insulating film 15 and the first portion 35a of the third insulating film 35, and reaches the first insulating film 31. Thereby, it is possible to oxidize the first insulating film 31 simultaneously with the conductive layer 130.

Figure 6I:
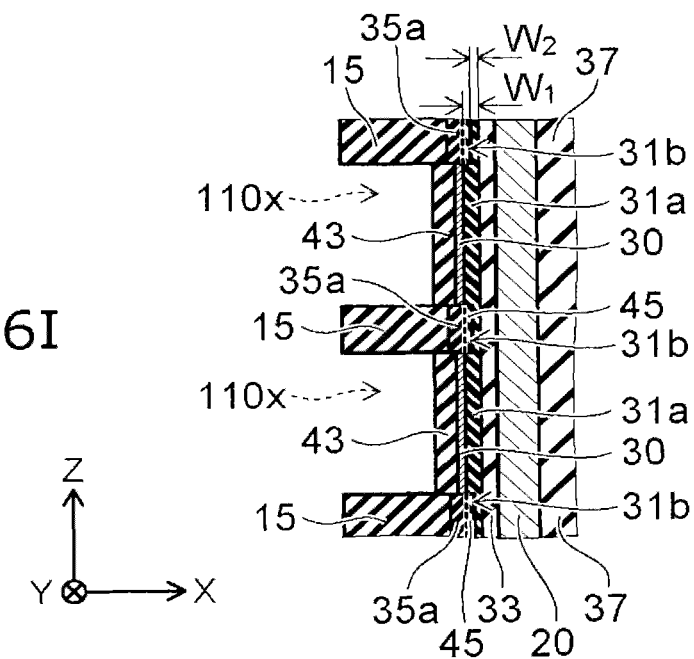

FIG. 6I shows a structure after oxidizing the conductive layer 130 and the first insulating film 31. A portion in which the conductive layer 130 is oxidized serves as the first layer 43, and the remaining portion serves as the conductive layer 30. The first layer 43 is, for example, a silicon oxide film.

The portion between the first portion 35a of the third insulating film 35 and the second insulating film 33 serves as the fifth insulating film 45, in which the first insulating film 31 is oxidized. The fifth insulating film 45 is, for example, a silicon oxide film or a silicon oxynitride film.

The first insulating film 31 includes the first portion 31a and the second portion 31b by the above-mentioned oxidation. The first portion 31a is formed between the conductive layer 30 and the second insulating film 33. The second portion 31b is a portion left behind without being oxidized between the second insulating film 33 and the first portion 35a of the third insulating film 35. The width of the first portion 31a in a direction (for example, X-direction in the drawing) perpendicular to the Z-direction is $W_1$. The width of the second portion 31b in a direction perpendicular to the Z-direction is $W_2$. $W_1$ is larger than $W_2$.

In this example, an example is illustrated in which the conductive layer 130 which is a silicon layer and the first insulating film 31 which is a silicon nitride film are oxidized, but the embodiment is not limited thereto. For example, the conductive layer 130 may be nitrided by supplying nitrogen radicals instead of oxidation. In that case, a metal oxide film such as, for example, a hafnium oxide can be used in the first insulating film 31.

Figure 6J:
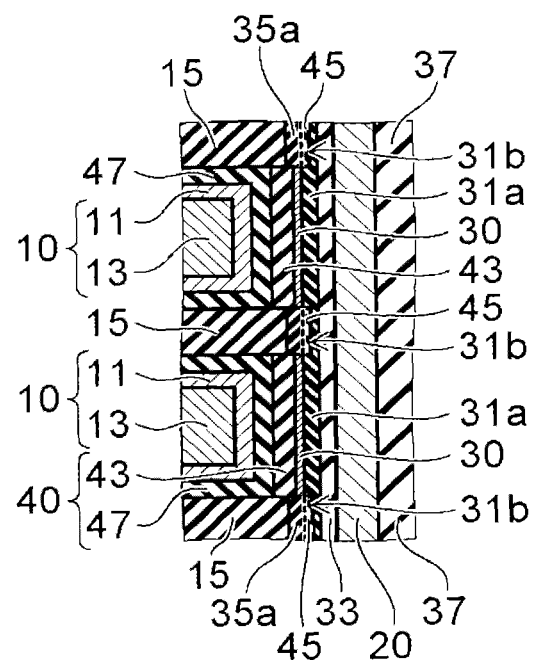

As shown in FIG. 6J, the second layer 47, the first electrode layer 11, and the second electrode layer 13 are formed inside the space 110x. The second layer 47 is formed on the first layer 43 and the interlayer insulating film 15.

The control gate 10 includes, for example, the first electrode layer 11 and the second electrode layer 13. The first electrode layer 11 is formed on the second layer 47, and the second electrode layer 13 buries the inside of the space 110x, on the first electrode layer 11. The first electrode layer 11 is, for example, a titanium nitride (TiN). The first electrode layer 11 functions as a barrier metal for suppressing the transfer of metal atoms from the control gate 10 to the memory cell MC. The second electrode layer 13 is, for example, tungsten (W).

The fourth insulating film 40 includes the first layer 43 and the second layer 47. The second layer 47 is, for example, an aluminum oxide ($Al_2O_3$). The dielectric constant of the second layer 47 is larger than, for example, the dielectric constant of the first layer 43. Thereby, it is possible to reduce the electric field of the first layer 43, and to reduce a gate leakage current flowing from the conductive layer 30 to the control gate 10.

In this example, after the processes shown in FIGS. 6A to 6J, the insulating film 61 that buries the inside of the slit 60 is formed. Further, the selection transistor 50 and the bit line 80 are formed, and the non-volatile memory device 1 is completed. The embodiment is not limited to this example. For example, in the process of stacking the interlayer insulating film 15 and the sacrifice film 110 shown in FIG. 6A, a portion constituting the selection transistor 50 may be further stacked.

In the non-volatile memory device 1 according to the embodiment, the thickness $W_2$ of the second portion 31b is formed to be smaller than the thickness $W_1$ of the first portion 31a of the first insulating film 31. Thereby, it is possible to reduce electrons, for example, which are transferred to an adjacent memory cell through the second portion 31b. That is, it is possible to improve the charge holding characteristics of the memory cell MC.

Figure 7A:
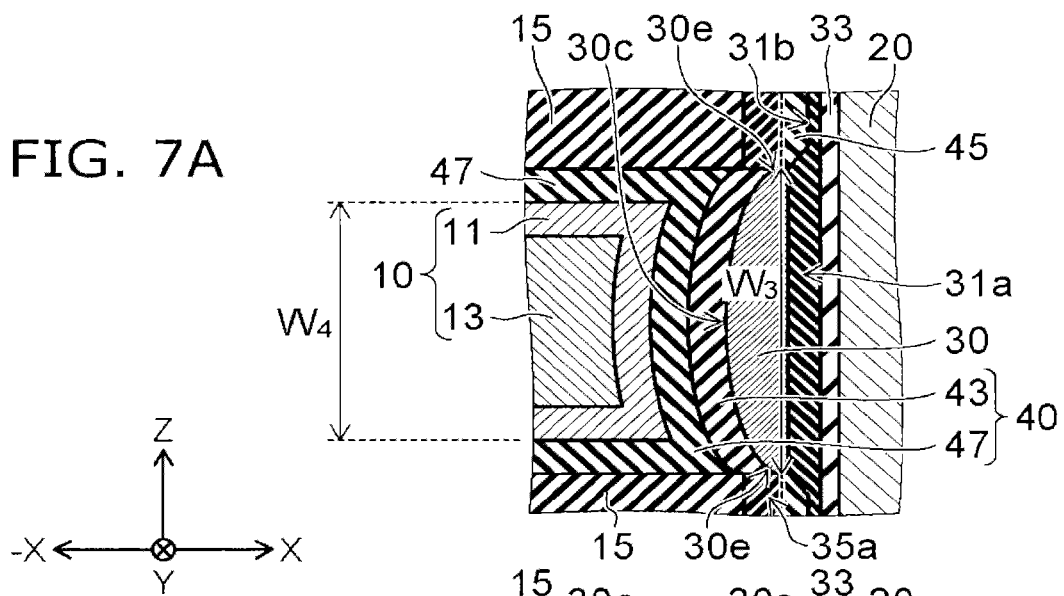
FIGS. 7A to 7C are schematic views illustrating a structure of a memory cell according to a variation of the first embodiment.
Figure 7B:
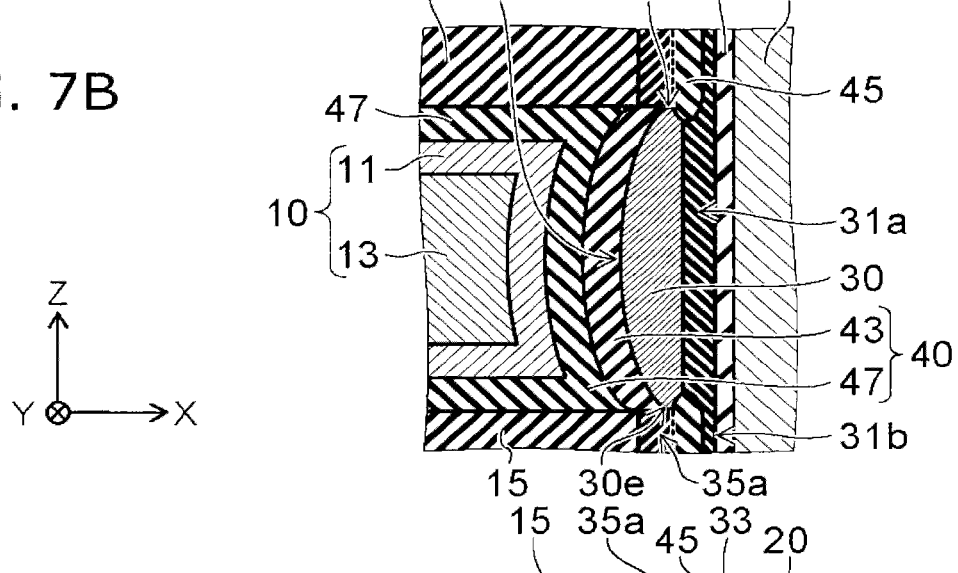
Figure 7C:
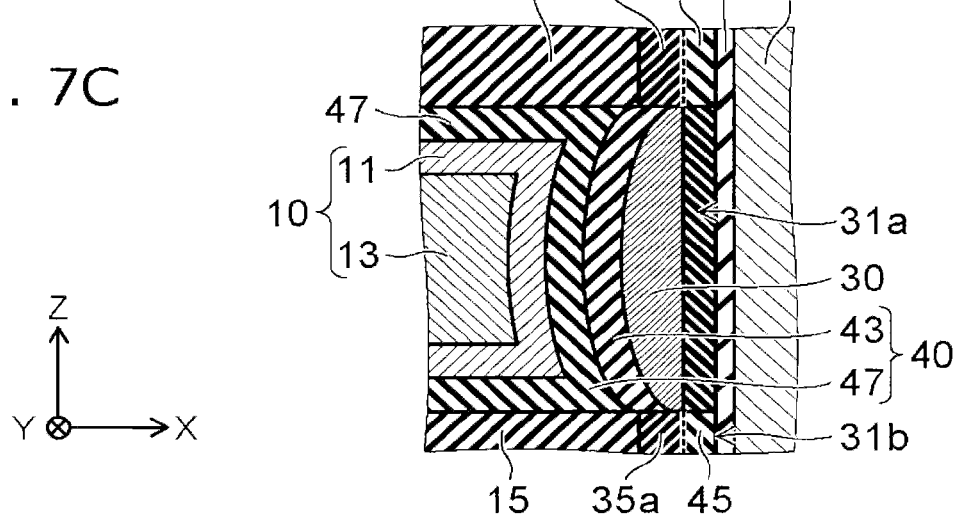

FIGS. 7A to 7C are schematic views illustrating a structure of a memory cell MC according to a variation of the first embodiment. For example, it is possible to optimize the structure of the memory cell MC by controlling the thickness of the conductive layer 130 in a direction perpendicular to the Z-direction, and the time of oxidation.

As shown in FIG. 7A, the width $W_3$ of the conductive layer 30 in the Z-direction can be formed so as to become larger than the width $W_4$ of the control gate 10 in the Z-direction. Thereby, it is also possible to hold electrons at the end 30e in the Z-direction without being limited to a central portion 30c of the conductive layer 30.

At both ends of the conductive layer 130 in the Z-direction, oxidation progresses more rapidly than at the central portion thereof due to the shape effect. Therefore, the conductive layer 30 has a shape in which the width at the end 30e in the Z-direction which is in a direction perpendicular to the Z-direction is smaller than the width at the central portion 30c which is in a direction perpendicular to the Z-direction. In other words, the conductive layer 30 becomes smaller in width in a direction perpendicular to the Z-direction as the width as the conductive layer is closer to the end along the Z-direction or a direction opposite thereto.

In the memory cell MC of FIG. 7A, the area of a surface facing the control gate 10 in the conductive layer 30 becomes larger, and thus it is possible to increase a coupling ratio. As a result, it is possible to suppress the malfunction of the memory cell MC, and to improve the reliability thereof.

FIG. 7B shows a structure, in which oxidation has progressed more rapidly than in the example shown in FIG. 7A. The oxidation of the first insulating film 31 progresses, and the end 30e of the conductive layer 30 is formed like an acute shape in the Z-direction or −Z-direction, that is, a so-called Bird's beak. In other words, the width $W_3$ of the conductive layer 30 in the Z-direction becomes larger than the length of an interface in the Z-direction which is in contact with the first insulating film 31.

In the memory cell MC shown in FIG. 7B, a silicon oxide film obtained by oxidizing the first insulating film 31 is interposed, for example, between the end 30e of the conductive layer 30 and the first insulating film 31. Therefore, it is possible to suppress the transfer of electrons from the end 30e of the conductive layer 30 through the second portion 31b of the first insulating film 31 to an adjacent memory cell. Therefore, it is possible to improve the charge holding characteristics of the memory cell MC.

FIG. 7C shows an example in which all the first insulating films 31 located between the second insulating film 33 and the first portion 35a of the third insulating film 35 are oxidized, and the fifth insulating film 45 is formed. The memory cell MC of FIG. 7C does not include the second portion 31b of the first insulating film 31. Therefore, it is possible to prevent electrons from being transferred through the second portion 31b to an adjacent memory cell. Thereby, it is possible to improve the charge holding characteristics of the memory cell MC.

Second Embodiment

Figure 8A:
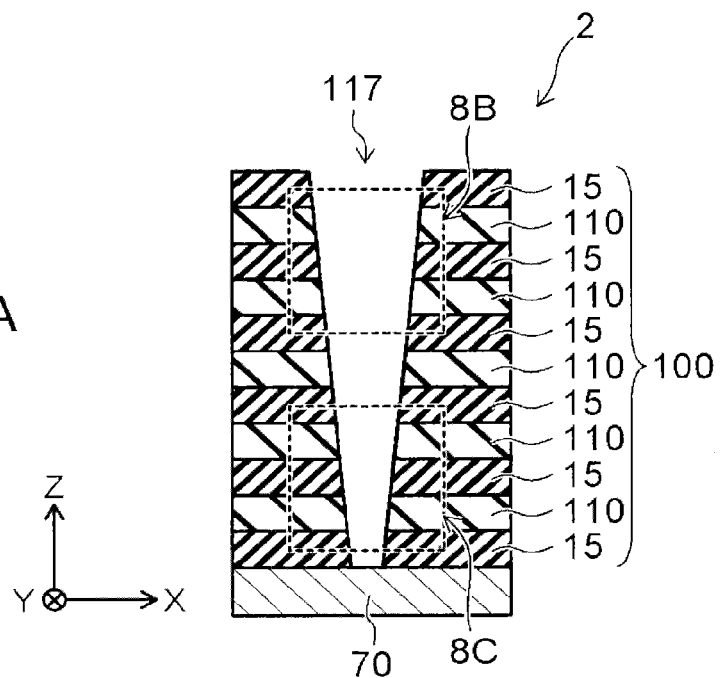
FIGS. 8A to 8C are examples of schematic views illustrating a non-volatile memory device according to a second embodiment.
Figure 8B:
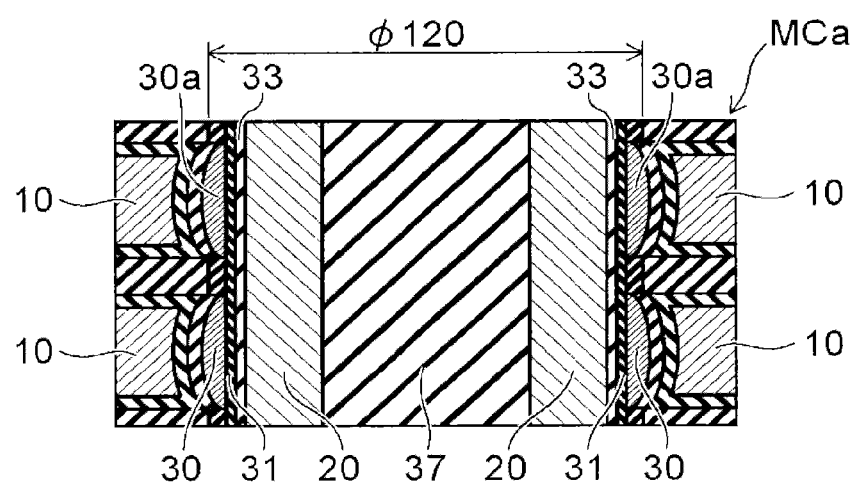
Figure 8C:
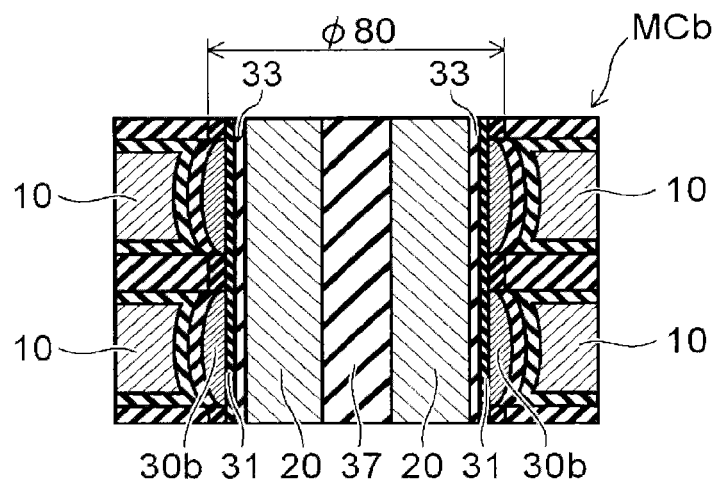

FIGS. 8A to 8C are schematic views illustrating a non-volatile memory device 2 according to a second embodiment. FIG. 8A is a schematic cross-sectional view illustrating a shape of a memory hole 117 of the non-volatile memory device 2. FIG. 8B is a partial cross-sectional view illustrating a first memory cell (hereinafter, memory cell MCa) provided in a region 8B shown in FIG. 8A. FIG. 8C is a partial cross-sectional view illustrating a second memory cell (hereinafter, memory cell MCb) provided in a region 8C shown in FIG. 8A.

As shown in FIG. 8A, the memory hole 117 is configured such that its diameter in a direction perpendicular to the Z-direction is smaller at the source interconnection 70 side. For example, when the stacked body 100 is etched using RIE to form the memory hole 117, there is a tendency for the diameter to decrease in a depth direction.

As shown in FIG. 8B, the memory cell MCa includes a first conductive layer (hereinafter, conductive layer 30a). In addition, as shown in FIG. 8C, the memory cell MCb includes a second conductive layer (hereinafter, conductive layer 30b). The diameter of the conductive layer 30a in a direction perpendicular to the Z-direction is larger than the diameter of the conductive layer 30b in a direction perpendicular to the Z-direction.

For example, even when the same control voltage is applied between the control gate 10 and the channel body 20, in the memory cell MCb provided in the region 8C, the electric field of the tunnel insulating film (that is, second insulating film 33) becomes higher than the electric field of the tunnel insulating film of the memory cell MCa provided in the region 8B, due to a curvature effect. As a result, for example, a minimum voltage required for writing data in the memory cell MCa becomes higher than a minimum voltage required for writing data in the memory cell MCb. For example, when the writing voltage of the non-volatile memory device 2 is set to a level at which data is written in the memory cell MCa, an excessive voltage is applied to the memory cell MCb.

On the other hand, in the embodiment, the coupling ratio of the memory cell MCb is made to be smaller than the coupling ratio of the memory cell MCa. Thereby, it is possible to reduce the electric field of the tunnel insulating film of the memory cell MCb, and to make the writing voltage uniform.

Specifically, in the process of forming the conductive layer 130 shown in FIG. 6G, for example, the pressure of epitaxial growth is made to be higher, and thus the conductive layer 130 located above the memory hole 17 is formed to be thicker than the conductive layer 130 located below the memory hole 17. In the oxidation process shown in FIG. 6H, the oxidation at the end progresses as the conductive layer 130 is thicker. For this reason, at the upper portion side of the memory hole 117, the conductive layer 30 has a shape in which the area of a surface facing the control gate 10 is larger. As a result, the coupling ratio of the memory cell MCa can be made to be higher than the coupling ratio of the memory cell MCb.

In this manner, in the embodiment, the coupling ratio of the memory cell MCa provided at the upper portion of the memory hole 117 is made to be higher than the coupling ratio of the memory cell MCb provided at the lower portion thereof, and thus it is possible to improve the non-uniformity of a writing voltage (or erasing voltage), and to improve the reliability of the non-volatile memory device 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A non-volatile memory device comprising:
a plurality of electrodes arranged side by side in a first direction with an interlayer insulating film interposed;
at least one semiconductor layer extending into the plurality of electrodes in the first direction;

conductive layers provided between each of the plurality of electrodes and the semiconductor layer, the conductive layers being separated from each other in the first direction;

a first insulating film in contact with the conductive layers, and extending in the first direction along the semiconductor layer between the conductive layers and the semiconductor layer; and a second insulating film provided between the first insulating film and the semiconductor layer, the second insulating film having an energy bandgap wider than an energy bandgap of the first insulating film, the first insulating film including a first portion located between the conductive layers and the second insulating film, and a second portion located between the interlayer insulating film and the second insulating film, and a thickness of the first portion in a direction perpendicular to the first direction is larger than a thickness of the second portion in the direction perpendicular to the first direction.

2. The non-volatile memory device according to claim 1, further comprising:

a third insulating film provided between the interlayer insulating film and the first insulating film; and a fourth insulating film provided between each of the electrodes and the conductive layers.

3. The non-volatile memory device according to claim 2, wherein the fourth insulating film includes a first layer and a second layer, the first layer is provided between the conductive layers and the second layer, and the second layer has a dielectric constant higher than a dielectric constant of the first layer.

4. The non-volatile memory device according to claim 3, wherein the second layer extends between each of the electrodes and the interlayer insulating film adjacent to each of the electrodes.

5. The non-volatile memory device according to claim 4, wherein the first layer includes an oxide of elements constituting the conductive layers.

6. The non-volatile memory device according to claim 3, wherein the first layer is an aluminum oxide, and the second layer is a silicon oxide.

7. The non-volatile memory device according to claim 2, further comprising a fifth insulating film provided between the third insulating film and the first insulating film, the fifth insulating layer including an oxide of constituent elements of the first insulating film.

8. The non-volatile memory device according to claim 7, wherein the first insulating film is a silicon nitride film, and the fifth insulating film is a silicon oxynitride film.

9. The non-volatile memory device according to claim 1, wherein a width of the conductive layers in the first direction is larger than a width of the electrodes in the first direction.

10. The non-volatile memory device according to claim 1, wherein the conductive layer becomes smaller in a width in a direction perpendicular to the first direction as the conductive layers are closer to an end of each of the conductive layers along the first direction or a direction opposite to the first direction.

11. The non-volatile memory device according to claim 10, wherein a width of the conductive layers in the first direction is larger than a length in the first direction of an interface where the conductive layers is in contact with the first insulating film.

12. The non-volatile memory device according to claim 1, further comprising:

a first memory cell including a first conductive layer provided between an end electrode of the electrodes and the semiconductor layer; and a second memory cell including a second conductive layer provided between another end electrode of the electrodes and the semiconductor layer, a diameter of a cross-section of the first conductive layer perpendicular to the first direction being larger than a diameter of a cross-section of the second conductive layer perpendicular to the first direction, and a coupling ratio of the first memory cell being larger than a coupling ratio of the second memory cell.

13. The non-volatile memory device according to claim 1, wherein the conductive layers are a silicon layer.

14. A non-volatile memory device comprising:

a plurality of electrodes arranged side by side in a first direction with an interlayer insulating film interposed;

at least one semiconductor layer extending into the plurality of electrodes in the first direction;

conductive layers provided between each of the plurality of electrodes and the semiconductor layer, the conductive layers being separated from each other in the first direction;

first insulating films provided between each of the conductive layers and the semiconductor layer, and in contact with the conductive layers, the first insulating films being separated from each other in the first direction; and a second insulating film provided between the first insulating films and the semiconductor layer, and extending in the first direction along the semiconductor layer, the second insulating film having an energy bandgap wider than an energy bandgap of the first insulating films.

15. The non-volatile memory device according to claim 14, further comprising:

a third insulating film provided between the interlayer insulating film and the first insulating films;

a fourth insulating film provided between each of the electrodes and the conductive layers; and a fifth insulating film provided between the third insulating film and the second insulating film, the fifth insulating film including an oxide of elements constituting the first insulating films, the fourth insulating film including a first layer including an oxide of elements constituting the conductive layers, and a second layer provided between each of the electrodes and the first layer.

16. The non-volatile memory device according to claim 15, wherein the first insulating films are a silicon nitride film, and the fifth insulating film is a silicon oxide film.

17. The non-volatile memory device according to claim 15, wherein the first insulating films are a silicon nitride film, and the fifth insulating film is a silicon oxinitride film.

18. A method for manufacturing a non-volatile memory device, comprising:

alternately stacking interlayer insulating films and sacrifice films in a first direction, and forming a stacked body including a plurality of the interlayer insulating films and a plurality of the sacrifice films;

forming a memory hole passing through the stacked body in the first direction;

forming a semiconductor layer, a first insulating film, a second insulating film and a third insulating film within the memory hole, and stacking in order of the third insulating film, the first insulating film, the second insulating film and the semiconductor layer on an inner wall of the memory hole;

forming a slit dividing the stacked body excluding the memory hole into a plurality of portions;

selectively removing the sacrifice films through the slit;

leaving a first portion of the third insulating film located between the interlayer insulating films and the first insulating film, removing a second portion of the third insulating film exposed after removing the sacrifice films, and exposing the first insulating film;

selectively forming a conductive layer on the first insulating film;

oxidizing a portion of the conductive layer and at least a portion of the first insulating film in contact with the first portion; and depositing an electrode layer in a space where the sacrifice films are selectively removed.

19. The method according to claim 18, wherein
the first insulating film is a silicon nitride film, and
the forming of the conductive layer includes forming of a silicon core on the silicon nitride film, and a process of growing a silicon crystal from the silicon core.

20. The method according to claim 19, wherein a portion of the conductive layer and the first insulating film are thermally oxidized.

* * * * *